(12) United States Patent
Yoshida et al.

(10) Patent No.: US 7,492,661 B2
(45) Date of Patent: Feb. 17, 2009

(54) COMMAND GENERATING CIRCUIT AND SEMICONDUCTOR MEMORY DEVICE HAVING THE SAME

(75) Inventors: Hiroyasu Yoshida, Tokyo (JP); Kanji Oishi, Tokyo (JP)

(73) Assignee: Elpida Memory, Inc., Tokyo (JP)

( * ) Notice: Subject to any disclaimer, the term of this patent is extended or adjusted under 35 U.S.C. 154(b) by 212 days.

(21) Appl. No.: 11/651,033

(22) Filed: Jan. 9, 2007

(65) Prior Publication Data

US 2007/0159910 A1    Jul. 12, 2007

(30) Foreign Application Priority Data

Jan. 10, 2006    (JP)    ............................. 2006-002436

(51) Int. Cl.
*G11C 8/00*    (2006.01)
(52) U.S. Cl. ............................. 365/230.03; 365/189.05; 365/230.08; 365/233.19
(58) Field of Classification Search ............ 365/230.03, 365/230.08, 233.19, 189.05
See application file for complete search history.

(56) References Cited

U.S. PATENT DOCUMENTS

| 5,867,447 | A |   | 2/1999  | Koshikawa |
|-----------|---|---|---------|-----------|
| 6,046,955 | A | * | 4/2000  | Suematsu et al. ...... 365/230.03 |
| 6,075,749 | A |   | 6/2000  | Isa |
| 6,466,511 | B2|   | 10/2002 | Fujita et al. |
| 6,965,534 | B2| * | 11/2005 | Kim ........................... 365/203 |

FOREIGN PATENT DOCUMENTS

| JP | 8-124380    | 5/1996 |
| JP | 9-139084    | 5/1997 |
| JP | 11-045571   | 2/1999 |
| JP | 2002-025254 | 1/2002 |

* cited by examiner

*Primary Examiner*—Pho M. Luu
(74) *Attorney, Agent, or Firm*—Foley & Lardner LLP

(57) ABSTRACT

In a command generating circuit, operation mode signals (signals determining internal operations, such as ACTIVE, READ, WRITE, and PRECHARGE) are determined by decoding command signals /CS, /RAS, /CAS, and /WE. The operation mode signals and bank select signals (BS0, BS1, BS2, and BS3) are latched by internal clocks. Thereafter, a logical product (AND) of each of the latched operation mode signals and each of the latched bank select signals is calculated.

7 Claims, 5 Drawing Sheets

COMMAND GENERATING CIRCUIT AND SEMICONDUCTOR MEMORY DEVICE HAVING THE SAME

This application claims priority to prior Japanese patent application JP 2006-002436, the disclosure of which is incorporated herein by reference.

BACKGROUND OF THE INVENTION

This invention relates to a command generating circuit and, in particular, to a command generating circuit which is improved in setup time of a command supplied from outside and to a semiconductor memory device having the same.

Recently, an electronic system is increased in speed and a data transfer speed between semiconductor devices constructing the system is drastically increased. Therefore, the semiconductor device itself is also required to perform a high-speed data transferring operation. Inside the semiconductor device, use is made of a clock synchronization system in which the operation is synchronized with a clock. For example, as a semiconductor memory device, there is a synchronous DRAM (Synchronous Dynamic Random Access Memory, will hereinafter be abbreviated to SDRAM). The SDRAM is further improved into SDRAMs of DDR (Double Data Rate) in which the data transferring operation is synchronized with rising and falling edges of the clock, DDR2, and DDR3 types.

In the SDRAM and the DDR-SDRAM, a prefetch system using a setup time (tIS) is generally adopted for the purpose of speeding up generation of an internal command. The prefetch system using the setup time (tIS) is a system in which decoding of a command and an address is preliminarily executed by the use of the setup time to assure a timing margin of an internal circuit and to quicken the generation of the command. However, following recent increase in clock frequency, a setup time specification gradually becomes strict. For example, the setup time tIS is 1500 ps in the SDRAM of 133 MHz and 600 ps in the DDR-SDRAM of 400 MHz. In the DDR2-SDRAM of 800 MHz, the setup time tIS is 375 ps. Thus, the timing margin gained by the prefetch system is gradually decreased as the clock frequency is increased.

A command generating circuit is disclosed in the following patent documents. In Japanese Unexamined Patent Application Publication (JP-A) No. H9-139084, a write pulse is generated in response to a command and a clock supplied from outside and a write cycle time is shortened. In Japanese Unexamined Patent Application Publication (JP-A) No. 2002-025254, fetching of an address, a command, and data is performed in synchronization with both of rising and falling of a clock signal. In Japanese Unexamined Patent Application Publication (JP-A) No. H8-124380, an operation of the SDRAM is assured by confirming that a mode register is properly set. In Japanese Unexamined Patent Application Publication (JP-A) No. H11-045571, an internal clock width is adjusted to thereby set a wide internal window width.

Referring to FIGS. 1 through 5, description will be made about a typical command generating circuit by the use of a bank active command generating circuit as an example. In this example, a DDR2-SDRAM having a four-bank structure is assumed. In the SDRAM (including the DDR and the DDR2), an operation is independent in each bank. Therefore, a command is generally generated by calculating a logical product (AND) of two signals. One of the two signals is an operation mode signal (corresponding to X00 and CS_T in FIG. 2) which is determined by decoding a chip selection signal /CS, a row address strobe signal /RAS, a column address strobe signal /CAS, or a write enable signal /WE (the symbol "/" means that a low state is active. The other signal is a bank select signal (BS0, BS1, BS2, or BS3) which is determined by decoding a bank address (BA0 or BA1). Thus, the command is generated by the two signals, i.e., the operation mode signal and the bank select signal.

FIG. 1 schematically shows an intermediate path from each of external terminals of the commands (/CS, /RAS, /CAS, and /WE) and the bank addresses (BA0 and BA1) to the command generating circuit. A command signal /CMD supplied to the external terminal PAD passes through an ESD protective element (ESD) (details thereof is omitted) and is converted into a converted command signal having a VDD amplitude at an input buffer (details thereof is omitted). Thereafter, the converted command signal passes through a delay (details thereof is omitted) for adjusting a timing with respect to an internal clock and is latched at a latch circuit (one example of details thereof is shown in FIG. 5) as an internal command signal CMD_T. The latched internal command signal CMD_T is supplied to the command generating circuit.

The command signal /CMD in FIG. 1 represents /CS, /RAS, /CAS, /WE, BA0, and BA1. The internal command signal CMD_T represents CS_T, RAS_T, CAS_T, WE_T, BA0_B, and BA1_B. With respect to a logic of the command signal /CMD to be supplied to a pad, logics of the internal command signals CS_T, RAS_T, CAS_T, WE_T, BA0_B, and BA1_B are inverted. Clocks ACLK_T and ACLK_B (B is an inversion signal) are the internal clocks for latching the commands, the bank address, and the like and are generated by delaying an external clocks CLK by an appropriate amount.

By setting /CS="L", /RAS="L", /CAS="H", and /WE="H" at rising of the external clock CLK, a bank active command is issued. A bank to be turned active is designated by the bank address. This operation will be described with reference to FIG. 2. When the bank active command is supplied from the external terminal, CS_T="H", RAS_T="H", CAS_T="L", and WE_T="L". As RAS_T="H", CAS_T="L", and WE_T="L", an output X00 of a three-input NOR circuit NO30 has an "H" state. On the other hand, by setting the bank address, one of the bank select signals (BS0, BS1, BS2, and BS3) is selected and turned into an "H" state.

As mentioned above, X00="H" and CS_T="H". Therefore, one of the three-input NAND circuits NA30, NA31, NA32, and NA33 is supplied with three input signals all of which have an "H" state and produces an output (an input to the latch circuit) having an "L" state (the other three three-input NAND circuits produce outputs having an "H" state). When the internal clock CCLK_T rises (CCLK_B falls), latch circuits LA00, LA01, LA02, and LA03 latch the above-mentioned data (outputs of the latch circuits are inverted with respect to input levels). Each of two-input NAND circuits NA20, NA21, NA22, and NA23 is supplied with the internal clock CCLK_T, as an enable signal, and is turned active by rising of CCLK_T. Thus, with respect to a bank selected by the bank select signal, the bank active command is issued ("H" state).

A first feature of the above-mentioned structure is that the logical product (AND) of the operation mode signal and the bank select signal is calculated at a preceding stage to the latch circuits (LA00, LA01, LA02, and LA03). Further, a second feature is that, after latching, each of the NAND circuits (NA20, NA21, NA22, and NA23) is supplied with CCLK_T as one input. The two features mentioned above provide a guard for preventing multi-issue of commands (simultaneous issue of commands to a plurality of banks). However, with this structure, the number of logic stages before latching is increased and it is difficult to assure the timing margin.

Referring to FIGS. 3 and 4, description will be made about an operation timing of the typical command generating circuit. FIG. 3 schematically shows timings from the external terminals to the generation of the commands and FIG. 4 shows details of the timings of the command generating circuit. For simplification of description, it is assumed that a delay time per each gate has a same value $\Delta t$. It is also assumed that a delay time of a transfer gate also has the same value $\Delta t$. The rising of the external clock CLK is used as a reference time $t=0$. A delay time from the external clock CLK to the internal clock CCLK_T is represented by $\Delta Tc$. A setup time of the command and the bank address with respect to the external clock CLK is represented by tIS.

As paths from the external terminals of the commands (/CS, /RAS, /CAS, and /WE) and bank addresses (BA0 and BA1) to the command generating circuit, the substantially same circuit (FIG. 1) is used. Therefore, although there is a slight difference depending upon a layout position, a substantially same time is required as a delay time after a signal is switched at the external terminal and before each of the internal commands CS_T, RAS_T, CAS_T, WE_T, BA0_B, and BA1_B is switched. This delay time is represented by $\Delta Ti$.

The internal commands CS_T, RAS_T, CAS_T, WE_T, BA0_B, and BA1_B are switched at a time instant $t=\Delta Ti-tIS$. The number of logic stages from RAS_T, CAS_T, and WE_T to a node X00 is two at maximum and the node X00 is determined at a time instant $\Delta Ti-tIS+2\Delta t$. On the other hand, the number of logic stages from BA0_B and BA1_B to the bank select signals (BS0, BS1, BS2, and BS3) is three at maximum and the bank select signals are determined at a time instant $\Delta Ti-tIS+3\Delta t$. Accordingly, nodes Y00, Y01, Y02, and Y03 are determined at a time instant $\Delta Ti-tIS+4\Delta t$ and nodes ACT00, ACT01, ACT02, and ACT03 are determined at a time instant $\Delta Ti-tIS+6\Delta t$.

In order to issue bank active commands (ACT0, ACT1, ACT2, and ACT3) with an original proper pulse width, the internal clock CCLK_T must rise after the nodes ACT00, ACT01, ACT02, and ACT03 are determined. Therefore, it is necessary to adjust a delay amount so that CCLK_T rises at a time instant not earlier than $\Delta Ti-tIS+6\Delta t$. The longer becomes a time required before CCLK_T is allowed to rise, the lower becomes the upper limit of a frequency at which the circuit is operable (a cycle of operation becomes longer).

A time period from determination of outputs Y00, Y01, Y02, and Y03 of the three-input NAND circuits to the rising of CCLK_T (a setup time of the latch circuit, i.e., a setup time of the command generating circuit) is given by $\Delta Tc-(\Delta Ti-tIS+4\Delta t)$. In case where data have not arrived no later than a predetermined time period prior to a time instant when a gate of the latch circuit is closed, data in the latch circuit can not be inverted and a latch failure or error is caused to occur. Let this limit time be represented by Tsl. Then, at a limit where the command generating circuit is normally operable, the following equation is given:

$$\Delta Tc-(\Delta Ti-tIS+4\Delta t)=Ts1 \quad (1)$$

The equation (1) is rewritten into:

$$tIS=Ts1+\Delta Ti+4\Delta t-\Delta Tc \quad (2)$$

This value is a minimum essential setup time (tIS) required in the circuit structure. In case where the delay time $\Delta Tc$ from the external clock CLK to the internal clock CCLK_T is increased, the setup time can be reduced. However, such increase in $\Delta Tc$ leads to lowering of a frequency at which the circuit is operable. At present, a higher frequency is used and the setup time specification gradually becomes strict. Therefore, an inventive circuit design is required. For this purpose, a command generating circuit is desired which is operable at a high clock frequency and is capable of assuring a sufficient setup time (tIS).

As mentioned above, in the semiconductor memory device, the clock frequency becomes higher and the timing margin gained by the prefetch system is decreased. Therefore, the command generating circuit capable of assuring a sufficient setup time (tIS) is desired.

SUMMARY OF THE INVENTION

In view of the above-mentioned problem, it is an object of this invention to provide a command generating circuit which can assure a setup time of an address and a command supplied from outside and which is operable at a high clock frequency.

It is another object of this invention to provide a semiconductor memory device having the above-mentioned command generating circuit.

Command generating circuits according to this invention and a semiconductor memory device according to this invention are as follows:

(1) A command generating circuit, wherein:

an operation mode signal and a bank select signal are latched to produce a latched operation mode signal and a latched bank select signal, respectively, the latched operation mode signal and the latched bank select signal being subjected to a logical operation to generate a command.

(2) The command generating circuit as described in (1), wherein the latched operation mode signal and the latched bank select signal are generated by latching the operation mode signal and the bank select signal in synchronization with complementary internal clocks.

(3) The command generating circuit as described in (2), wherein a latch circuit for latching the operation mode signal and the bank select signal comprises a transfer gate supplied with the complementary internal clocks as a gate input, a flip-flop for latching an output of the transfer gate, and an inverter circuit for inverting the output of the transfer gate to produce an inverted output.

(4) The command generating circuit as described in (2), wherein the logical operation is carried out in response to one of the complementary internal clocks as an enable signal to produce a logical product (AND) of the latched operation mode signal and the latched bank select signal.

(5) The command generating circuit as described in (1), wherein the operation mode signal and the bank select signal are latched at a timing delayed by not less than a predetermined delay time from a timing when an internal command signal and an internal bank address signal are supplied, the predetermined delay time corresponding to three stages of logic gates.

(6) The command generating circuit as described in (1), wherein the operation mode signal is produced by an operation mode signal section comprising a NOR circuit supplied with an internal column address strobe signal and an internal write enable signal, and a NAND circuit supplied with an output of the NOR circuit, a chip selection signal, and a row address strobe signal.

(7) A semiconductor memory device comprising the command generating circuit described in any one of (1) through (6).

In the command generating circuit of the present invention, each of the operation mode signals (signals determining internal operations, such as ACTIVE, READ, WRITE, and PRECHARGE) determined by decoding the command signals /CS, /RAS, /CAS, and /WE and each of the bank select signals (BS0, BS1, BS2, and BS3) are latched by the internal clocks. By calculating a logical product (AND) after latching, it is possible to enlarge a setup (tIS) margin by approximately 25%. With this structure, it is possible to obtain a command generating circuit operable at a high clock frequency and a semiconductor memory device having the same.

DESCRIPTION OF THE PREFERRED EMBODIMENT

Figure 6:
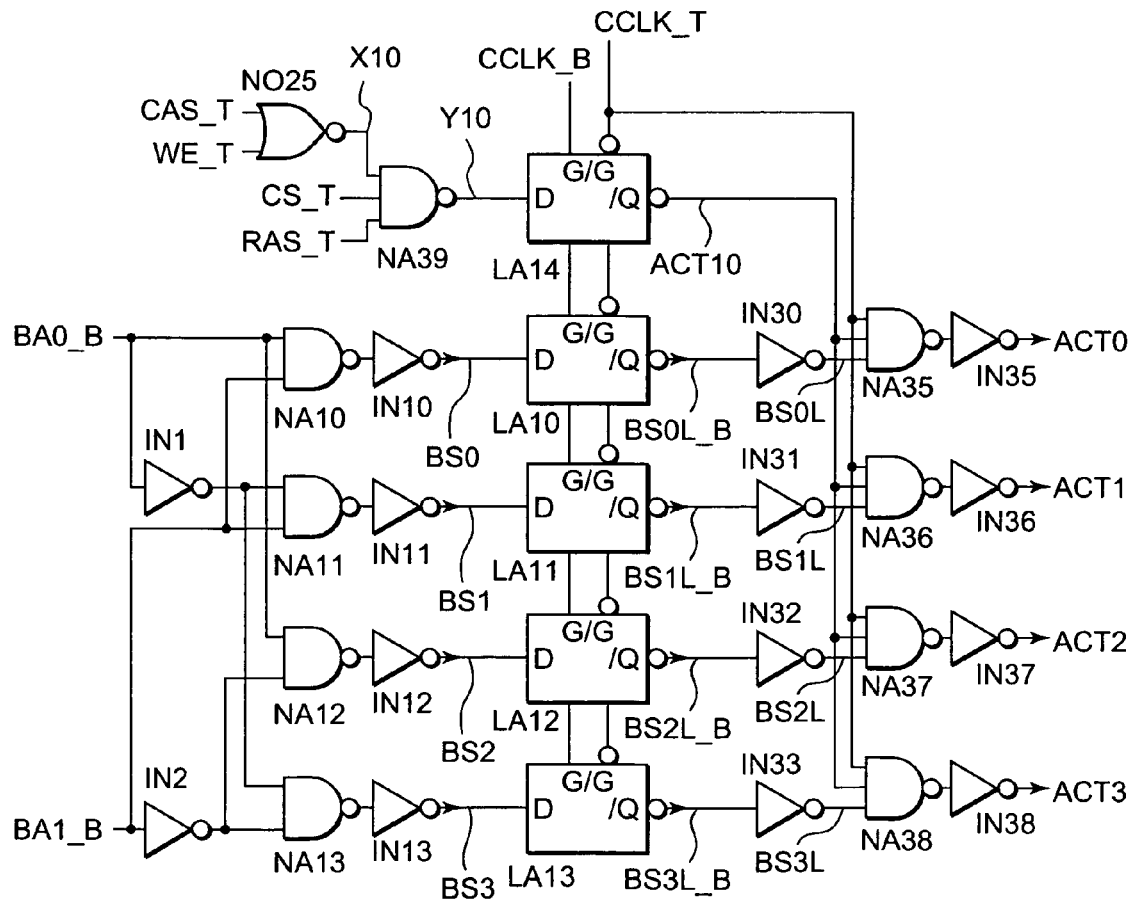
FIG. 6 is a circuit diagram of a command generating circuit according to an embodiment of the present invention and FIG. 7 is a timing chart for describing operation timings in FIG. 6.

Now, referring to FIGS. 6 and 7, an embodiment of the present invention will be described in detail. In the following description, a bank active command generating circuit will be described as an example of a command generating circuit.

The command generating circuit comprises an operation mode signal section, a bank address section, and a logic processing circuit. The operation mode signal section comprises a NOR circuit NO25, a NAND circuit NA39, and a latch circuit LA14. The NOR circuit NO25 is supplied with internal commands CS_T and WE_T and delivers an output X10 to the NAND circuit NA39. The NAND circuit NA39 is supplied with X10, RAS_T and CAS_T and delivers an output Y10 to the latch circuit LA14. The latch circuit LA14 latches the output Y10 supplied from the NAND circuit NA39 and delivers an output ACT10 to NAND circuits NA35, NA36, NA37, and NA38 in synchronization with internal clocks CCLK_T and CCLK_B.

The bank address section comprises inverter circuits IN1 and IN2, two-input NAND circuits NA10, NA11, NA12, and NA13, inverter circuits IN10, IN11, IN12, and IN13, latch circuits LA10, LA11, LA12, and LA13, and inverter circuits IN30, IN31, IN32, and IN33. The inverter circuits IN1 and IN2 invert bank addresses BA0_B and BA1_B to produce BA0_T and BA1_T, respectively. Each of the two-input NAND circuits NA10, NA11, NA12, and NA13 is supplied with the bank address BA0_B or BA0_T and the bank address BA1_B or BA1_T and performs bank-selection. The inverter circuits IN10, IN11, IN12, and IN13 invert respective input signals and produce bank select signals BS0, BS1, BS2, and BS3, respectively.

The bank select signals BS0, BS1, BS2, and BS3 are supplied to the latch circuits LA10, LA11, LA12, and LA13 and, in synchronization with the internal clocks CCLK_T and CCLK_B, delivered to the inverter circuits IN30, IN31, IN32, and IN33, respectively. The inverter circuits IN30, IN31, IN32, and IN33 deliver latched bank select signals BS0L, BS1L, BS2L, and BS3L which are synchronized with the internal clocks CCLK_T and CCLK_B, to the NAND circuits NA35, NA36, NA37, and NA38, respectively.

The NAND circuits NA35, NA36, NA37, and NA38 are AND circuits for combining the operation mode signal section and the bank address section. The NAND circuits NA35, NA36, NA37, and NA38 are supplied with the output ACT10 of the operation mode signal section and the latched bank select signals BS0L, BS1L, BS2L, and BS3L as outputs of the bank address section and produce outputs in response to the internal clock CCLK_T as an enable signal. Inverter circuits IN35, IN36, IN37, and IN38 are supplied with the respective outputs of the NAND circuits NA35, NA36, NA37 and produce bank active signals ACT0, ACT1, ACT2, and ACT3, respectively.

When the bank addresses (BA0 and BA1) are supplied from external terminals, CS_T="H", RAS_T="H", CAS_T="L", and WE_T="L". Therefore, the output Y10 of the three-input NAND circuit NA39 has an "L" state. When the internal clock signal CCLK_T rises (CCLK_B falls), the latch circuit LA14 latches Y10. The latch circuit LA14 produces the output ACT10 having an "H" state (logic of Y10 is inverted). The output ACT10 does not contain bank information.

On the other hand, the bank select signals BS0, BS1, BS2, and BS3 are latched by the latch circuits LA10, LA11, LA12, and LA13 when the internal clock signal CCLK_T rises (CCLK_B falls). One of the latched bank select signals BS0L, BS1L, BS2L, and BS3L has an "H" state and the other three signals have an "L" state. The three-input NAND circuits NA35, NA36, NA37, and NA38 are supplied with the internal clock CCLK_T as an enable signal. Activated by rising of CCLK_T, the three-input NAND circuits NA35, NA36, NA37, and NA38 produce bank active commands ACT0, ACT1, ACT2, and ACT3 ("H" state) for those banks selected by the bank select signals BS0, BS1, BS2, and BS3.

Figure 7:
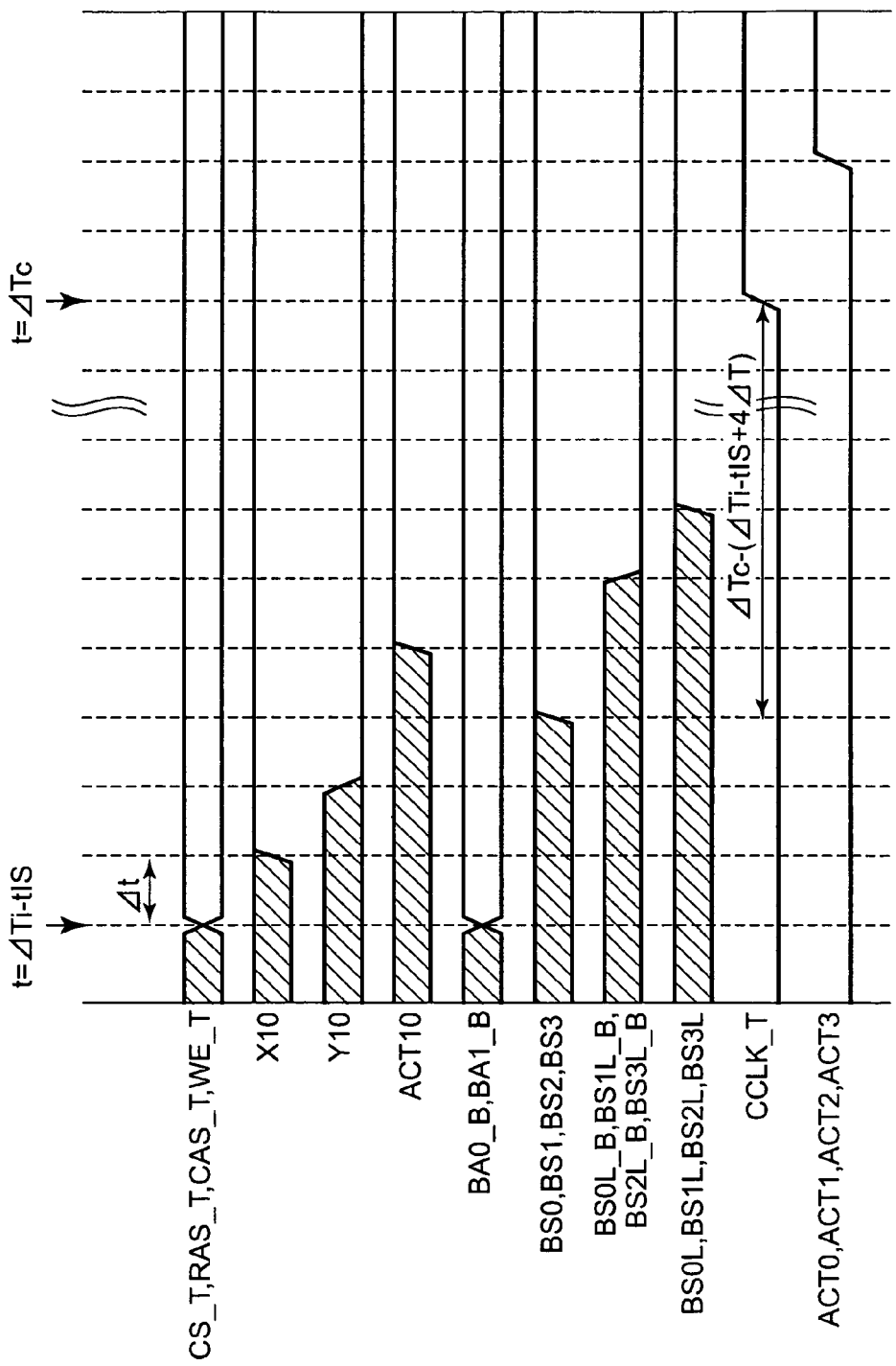

Referring to FIG. 7, description will be made about operation timings of the command generating circuit of this embodiment. As an operation mode group, a waveform of the internal commands CS_T, RAS_T, CAS_T, and WE_T, and waveforms of the output X10 of the NOR circuit NO25, the output Y10 of the NAND circuit NA39, and the output ACT10 of the latch circuit LA14 are illustrated in the figure. As a bank address group, waveforms of the internal bank addresses BA0_B and BA1_B, the bank select signals BS0 through BS3, outputs BS0L_B through BS3L_B produced by the latch circuits, and the latched bank select signals BS0L through BS3L are illustrated in the figure. Further, the internal clock CCLK_T and the bank active commands ACT0 through ACT3 are illustrated in the figure.

Figure 1:
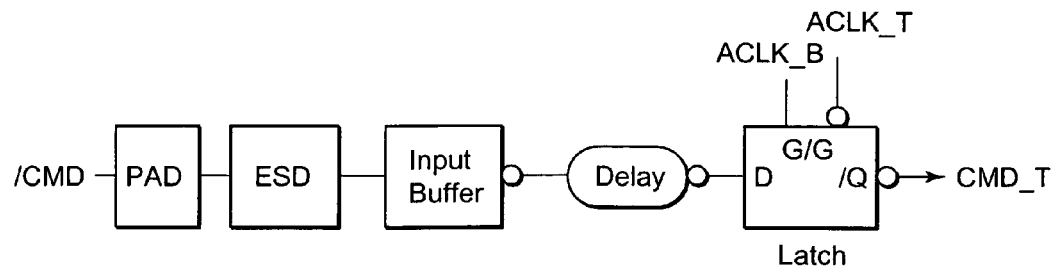
FIG. 1 is a schematic view showing a path from an external terminal to generation of an internal command.
Figure 2:
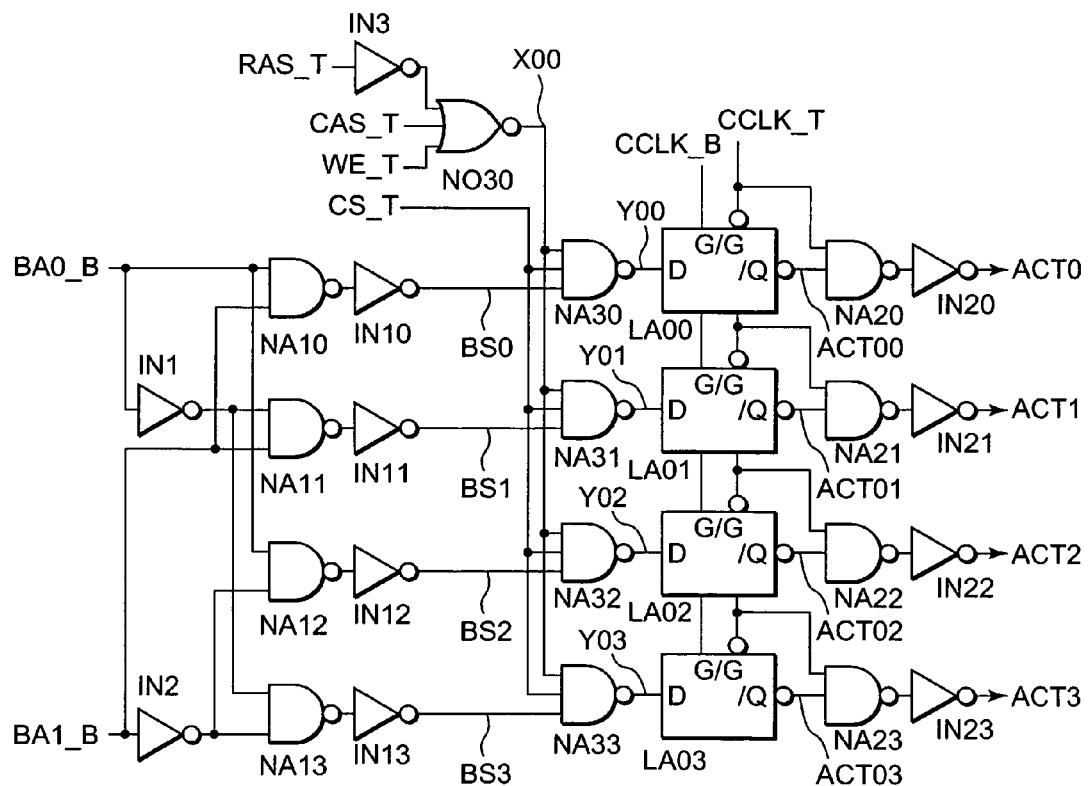
FIG. 2 is a circuit diagram of a typical command generating circuit.
Figure 3:
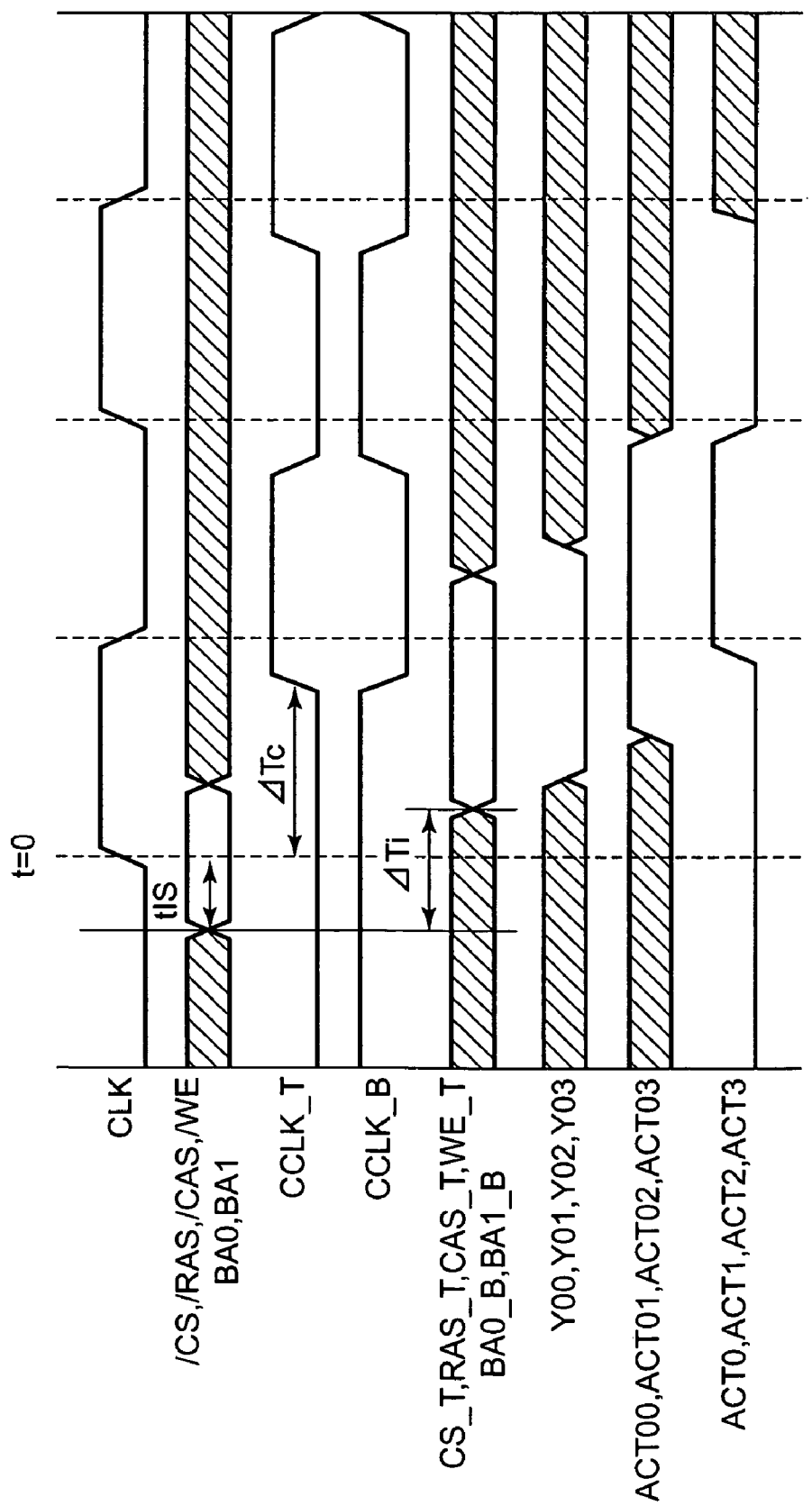
FIG. 3 is a timing chart for describing operation timings in FIG. 1.
Figure 4:
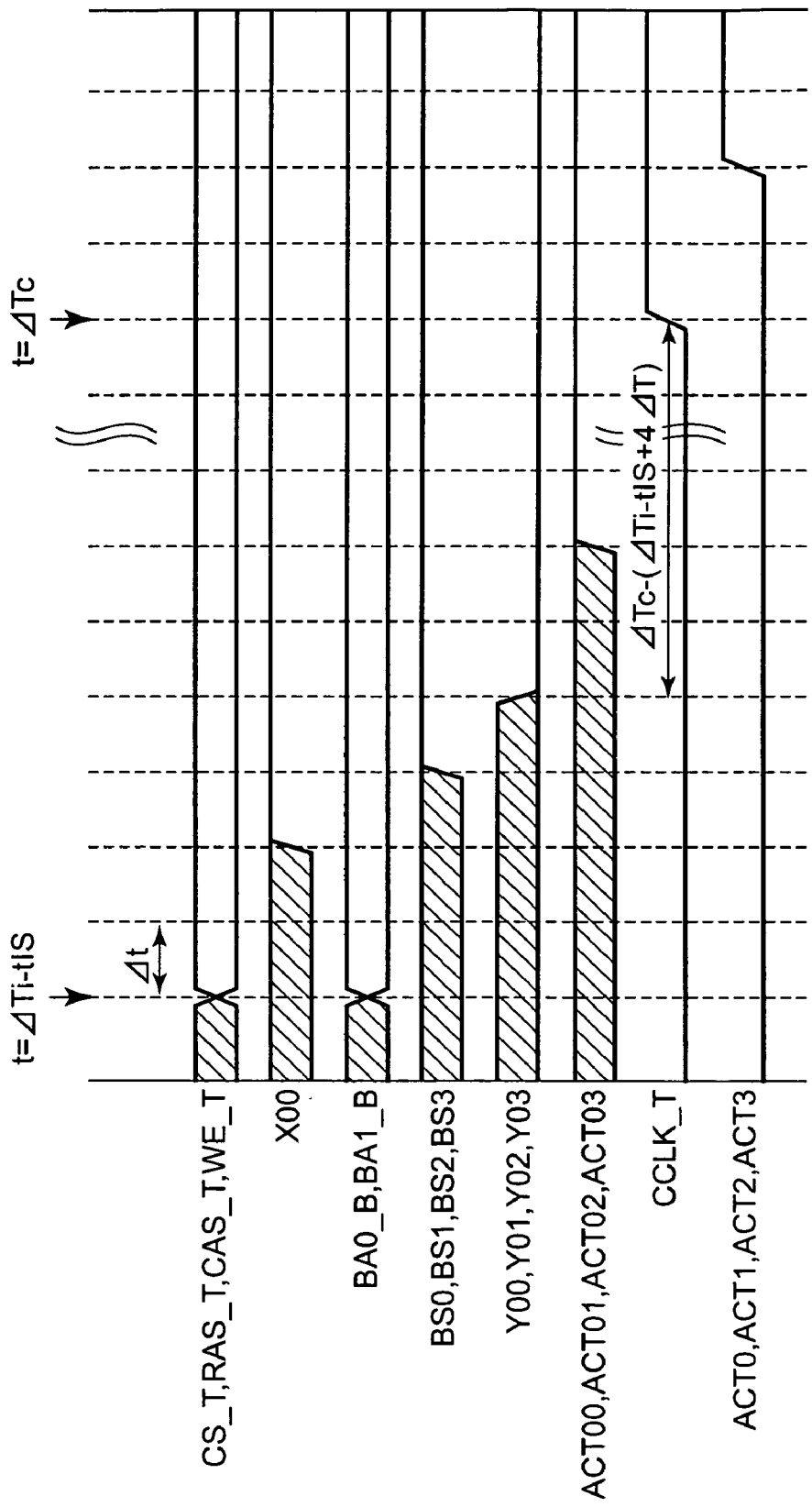
FIG. 4 is a timing chart for describing operation timings in FIG. 2.
Figure 5:
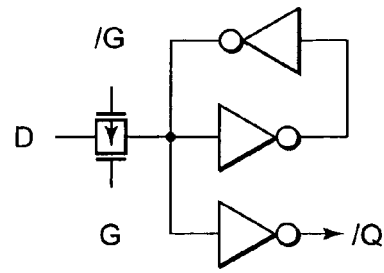
FIG. 5 is an example of a latch circuit in the command generating circuit in FIG. 2.

A path from the external clock CLK to the internal clock CCLK_T and paths from pads of the commands (/CS, /RAS, /CAS, and /WE) and the bank addresses (BA0 and BA1) to the command generating circuit are similar to that illustrated in FIG. 1. A command signal /CMD supplied from the external terminal passes through an ESD protective element (ESD) and is converted into a converted command signal having a VDD amplitude at an input buffer. Thereafter, the converted command signal passes through a delay for adjusting a timing with respect to the internal clocks and is latched at the latch circuit. The latched internal command signal CMD_T is supplied to the command generating circuit. One example of the latch circuit is shown in FIG. 5. The latch circuit comprises a transfer gate supplied with complementary internal clocks as a gate input, a flip-flop for latching an output of the transfer gate, and an inverter circuit for inverting the output of the transfer gate to produce an inverted output.

As described in conjunction with the typical circuit, a delay time from the external clock CLK to the internal clock CCLK_T is represented by ΔTc. The rising of the external clock CLK is used as a reference time t=0. It is assumed that a delay time of each of the signals CS_T, RAS_T, CAS_T, WE_T, BA0_B, and BA1_B is ΔTi from the commands (/CS, /RAS, /CAS, and /WE) and the bank addresses (BA0 and BA1). A setup time of each of the commands and the bank addresses with respect to the external clock CLK is represented by tIS.

The number of logic stages from the internal commands CS_T, RAS_T, CAS_T, and WE_T to a node Y10 is two at maximum and the node Y10 is determined at a time instant ΔTi−tIS+2Δt. On the other hand, the number of logic stages from the internal bank addresses BA0_B and BA1_B to the bank select signals (BS0, BS1, BS2, and BS3) is three at maximum and the bank select signals (BS0, BS1, BS2, and BS3) are determined at a time instant ΔTi−tIS+3Δt. A node ACT10 is determined at a time instant ΔTi−tIS+4Δt. The bank select signals (BS0L, BS1L, BS2L, and BS3L) which pass through the latch circuits are determined at a time instant ΔTi−tIS+6Δt.

When CCLK_T rises in the above-mentioned state, the commands (ACT0, ACT1, ACT2, and ACT3) are issued. Thus, a time required before CCLK_T is allowed to rise is not different from that in the typical circuit. That is, the upper limit of a frequency at which the circuit is operable can be equal to that in the typical circuit. The command generating circuit in FIG. 6 has a setup time ΔTc−(ΔTi−tIS+3Δt). Like in the typical circuit, when the setup time is equal to a limit setup time of the latch circuit, the command generating circuit reaches a limit of a normal operation. That is, the following equation is given:

$$\Delta Tc-(\Delta Ti-tIS+3\Delta t)=Ts1 \quad (3)$$

The equation (3) is rewritten into:

$$tIS=Ts1+\Delta Ti+3\Delta t-\Delta Tc \quad (4)$$

This value is a minimum essential setup time of the command and bank address in the circuit structure. It is understood that, as compared with the result (equation (2)) of the typical circuit, the minimum essential setup time (tIS) in the present invention is shorter by Δt.

In a recent practical example of the circuit, Δt is approximately equal to 100 ps or slightly lesser. In case of DDR2-SDRAM of 800 MHz, the value corresponds to approximately 25% of a setup time (tIS) specification of 375 ps and is not negligible in designing the timings of the circuit. In addition, in the circuit structure of the present invention, the latch circuit is required for the bank select signal. However, since this latch circuit for the bank select signal is shared with the other commands (READ, WRITE, PRECHARGE, etc.), no disadvantage is caused in view of an area.

In the command generating circuit of the present invention, each of the operation mode signals (signals determining internal operations, such as ACTIVE, READ, WRITE, and PRECHARGE) determined by decoding the signals /CS, /RAS, /CAS, and /WE and each of the bank select signals (BS0, BS1, BS2, and BS3) are latched by the internal clocks. Then, a logical product (AND) of the latched operation mode signal and the latched bank select signal is calculated, so that the setup (tIS) margin is enlarged. By enlarging the setup margin, a semiconductor memory device operable at a high clock frequency can be obtained.

While the present invention has been described in detail in connection with the embodiment, it will readily be understood that the present invention is not limited to the foregoing description but may be modified in various manners without departing from the scope of the present invention. Further, the foregoing description includes inventions at various stages. By appropriately combining disclosed elements, various inventions can be extracted. For example, even though several elements are deleted from the disclosed elements, inventions can be extracted as long as the predetermined effects are obtained.

What is claimed is:

1. A command generating circuit, wherein:
   an operation mode signal and a bank select signal are latched to produce a latched operation mode signal and a latched bank select signal, respectively, said latched operation mode signal and said latched bank select signal being subjected to a logical operation to generate a command.

2. The command generating circuit as claimed in claim 1, wherein said latched operation mode signal and said latched bank select signal are generated by latching said operation mode signal and said bank select signal in synchronization with complementary internal clocks.

3. The command generating circuit as claimed in claim 2, wherein a latch circuit for latching said operation mode signal and said bank select signal comprises a transfer gate supplied with said complementary internal clocks as a gate input, a flip-flop for latching an output of said transfer gate, and an inverter circuit for inverting the output of said transfer gate to produce an inverted output.

4. The command generating circuit as claimed in claim 2, wherein said logical operation is carried out in response to one of said complementary internal clocks as an enable signal to produce a logical product (AND) of said latched operation mode signal and said latched bank select signal.

5. The command generating circuit as claimed in claim 1, wherein said operation mode signal and said bank select signal are latched at a timing delayed by not less than a predetermined delay time from a timing when an internal command signal and an internal bank address signal are supplied, the predetermined delay time corresponding to three stages of logic gates.

6. The command generating circuit as claimed in claim 1, wherein said operation mode signal is produced by an operation mode signal section comprising a NOR circuit supplied with an internal column address strobe signal and an internal write enable signal, and a NAND circuit supplied with an output of said NOR circuit, a chip selection signal, and a row address strobe signal.

7. A semiconductor memory device comprising said command generating circuit claimed in any one of claims 1 through 6.

* * * * *